(12) United States Patent
Lyons et al.

(10) Patent No.: US 7,081,948 B2
(45) Date of Patent: *Jul. 25, 2006

(54) SYSTEM FOR AUTOMATED FOCUS MEASURING OF A LITHOGRAPHY TOOL

(75) Inventors: Joseph H. Lyons, Wilton, CT (US); Joseph G. Whelan, San Francisco, CA (US)

(73) Assignee: ASML Holding N.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/103,427

(22) Filed: Apr. 12, 2005

(65) Prior Publication Data

US 2005/0179883 A1    Aug. 18, 2005

Related U.S. Application Data

(63) Continuation of application No. 10/301,627, filed on Nov. 22, 2002, now Pat. No. 6,885,429.

(60) Provisional application No. 60/391,931, filed on Jun. 28, 2002.

(51) Int. Cl.
*G03B 27/52* (2006.01)
*G03B 27/42* (2006.01)

(52) U.S. Cl. .............................. 355/55; 355/53; 355/61

(58) Field of Classification Search ................. 355/53, 355/55, 61, 77; 356/125; 250/248

See application file for complete search history.

(56) References Cited

U.S. PATENT DOCUMENTS

| 4,326,805 A | 4/1982 | Feldman et al. |
| 4,786,166 A | 11/1988 | Kroko |
| 5,898,479 A | 4/1999 | Hubbard et al. |
| 5,991,004 A | 11/1999 | Wallace et al. |
| 6,236,477 B1 | 5/2001 | Ishihara et al. |
| 6,278,515 B1 | 8/2001 | Knight et al. |
| 6,501,532 B1 | 12/2002 | Suzuki |

(Continued)

FOREIGN PATENT DOCUMENTS

KR    10-0200729 B1    3/1999

OTHER PUBLICATIONS

English Abstract for Japanese Patent Publication No. 2000357656 A, published Dec. 26, 2000, 1 page.

(Continued)

*Primary Examiner*—Alan Mathews
(74) *Attorney, Agent, or Firm*—Sterne, Kessler, Goldstein & Fox P.L.L.C.

(57) ABSTRACT

A system and method are used to calibrate a focus portion of an exposure section of a lithography tool. A wafer is exposed so that a resulted or formed patterned image is tilted with respect to the wafer. The tilting can be imposed based on controlling a wafer stage to tilt the wafer or a reticle stage to tilt the reticle. The wafer is developed. Characteristics of the tilted patterned image are measured with a portion of the lithography tool to determine focus parameters of an exposure system. The portion can be an alignment system. The measuring step can measure band width and/or band location of the tilted patterned image. Sometimes, more than one patterned image is formed on the wafer, then the measuring step can measure distance between bands and shifting of the bands with respect to a central axis of the wafer. The focus parameters can be focus tilt errors and/or focus offset. The focus parameters are used to perform calibration. Calibration is done by either automatically or manually entering compensation values for the measured focus parameters into the lithography tool.

16 Claims, 14 Drawing Sheets

U.S. PATENT DOCUMENTS

| | | |
|---|---|---|
| 6,529,263 B1 | 3/2003 | Oguri et al. |
| 6,600,166 B1 | 7/2003 | Sato et al. |
| 6,885,429 B1 | 4/2005 | Lyons et al. |
| 2002/0021460 A1 | 2/2002 | Hansen |
| 2003/0002021 A1 | 1/2003 | Sato |
| 2004/0001192 A1 | 1/2004 | Lyons et al. |
| 2004/0165194 A1 | 8/2004 | Hansen |

OTHER PUBLICATIONS

Search Report from Singapore Patent Application No. 200303720-7, dated Jan. 29, 2004, 7 pages.

Written Opinion, from Singapore Patent Application No. 200303720-7, dated Apr. 8, 2005, 10 pages.

Written Opinion for Singapore Application No. 05251081.5 mailed on Oct. 11, 2005, 10 pages.

FIG. 5A
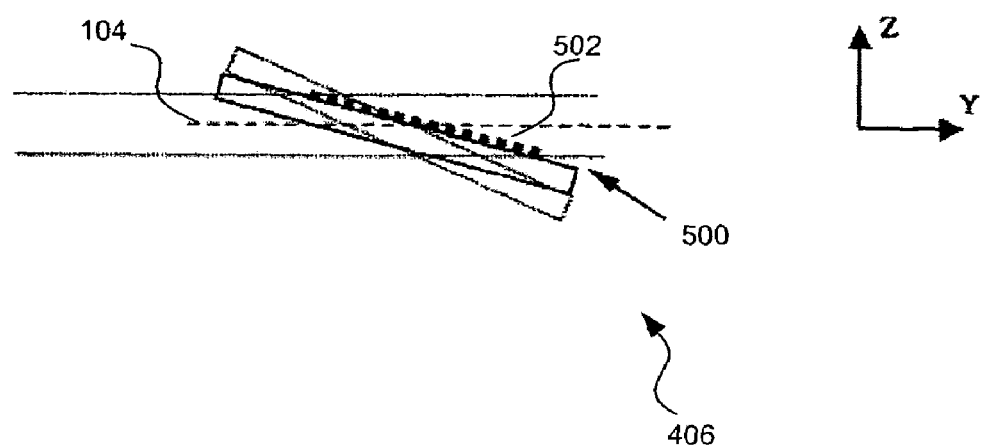
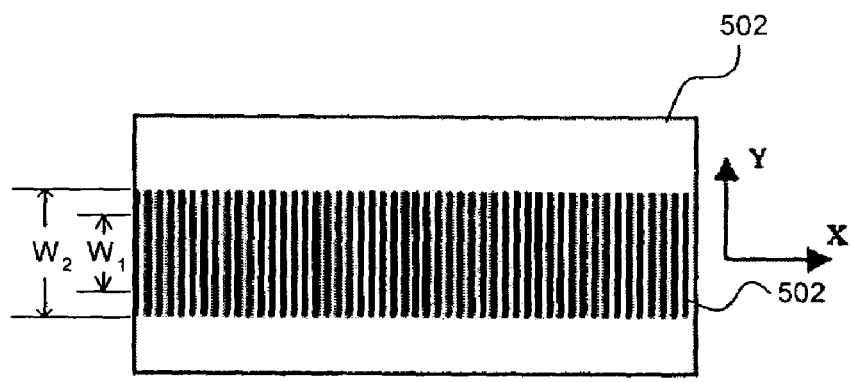
FIG. 5B

FIG. 6B
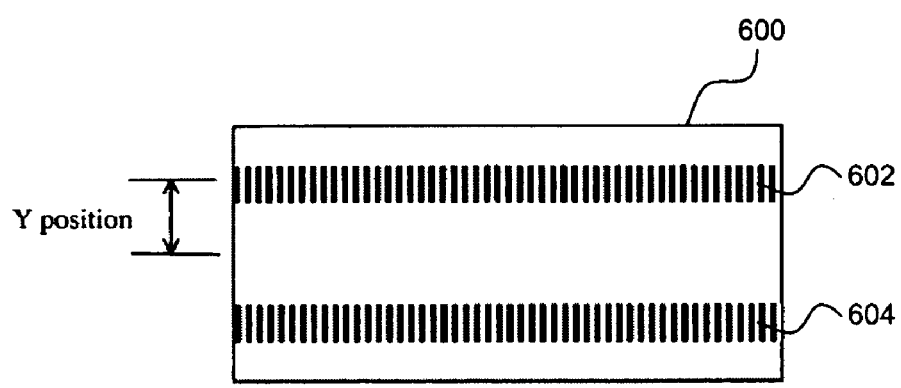
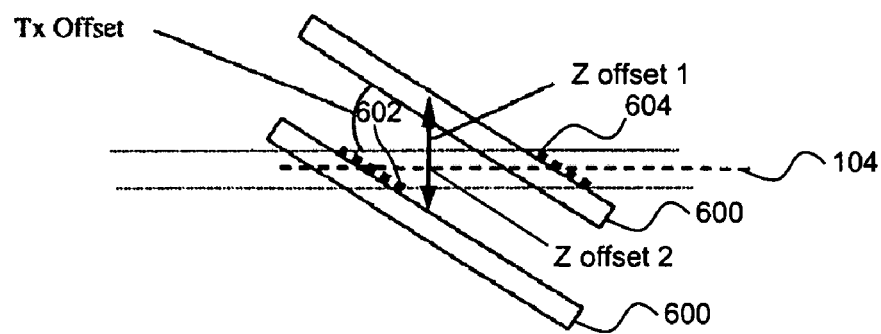
FIG. 6A

FIG. 7B
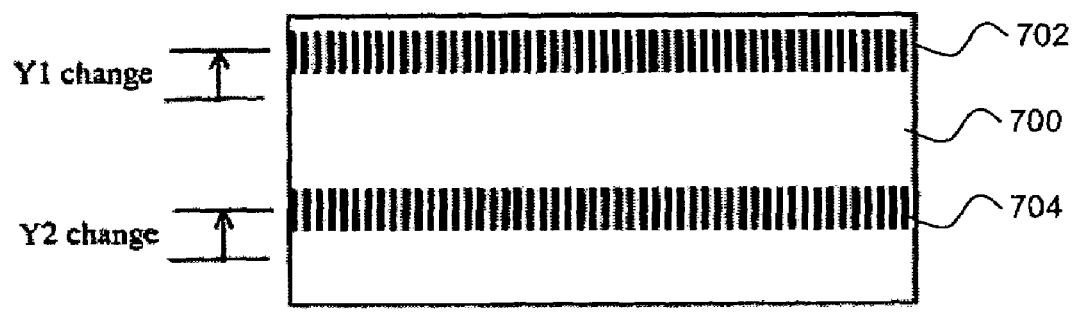
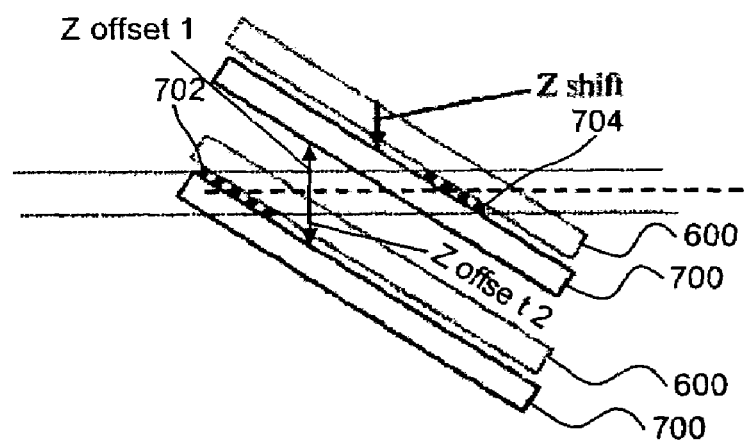
FIG. 7A

FIG. 8B
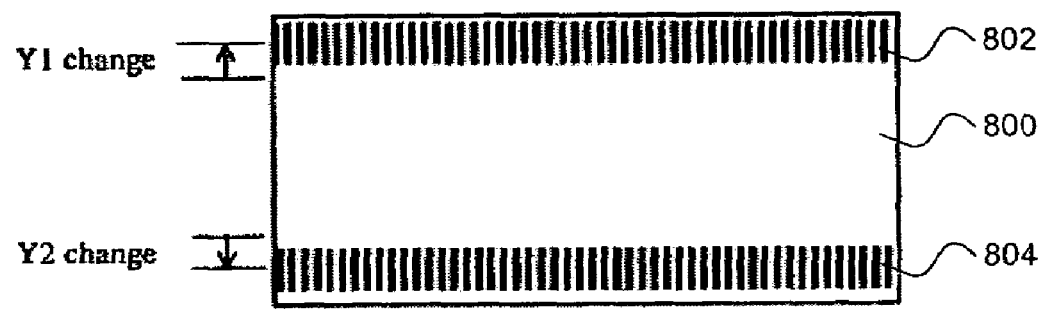
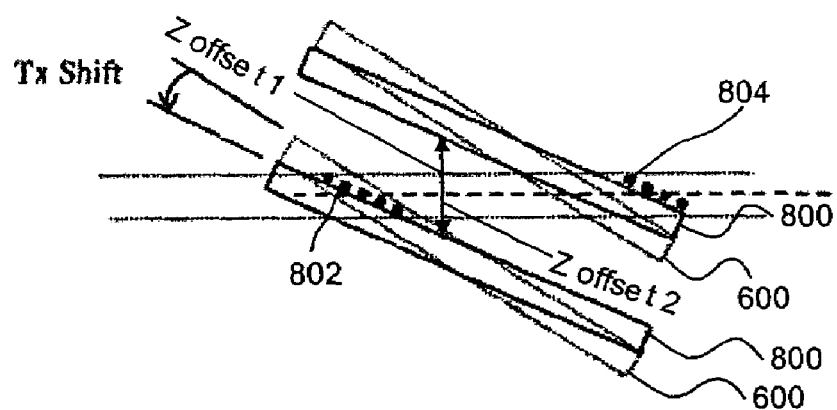
FIG. 8A

SYSTEM FOR AUTOMATED FOCUS MEASURING OF A LITHOGRAPHY TOOL

CROSS-REFERENCE TO RELATED APPLICATIONS

This application is a continuation of U.S. Ser. No. 10/301,627, filed Nov. 22, 2002 (now U.S. Pat. No. 6,885,429 that issued Apr. 26, 2005), which claims priority under 35 U.S.C. § 119(e) to U.S. Provisional Patent Application Ser. No. 60/391,93 1, filed Jun. 28, 2002, which are incorporated by reference herein in their entireties.

BACKGROUND OF THE INVENTION

1. Field of the Invention

The present invention is directed to a system and method for automated measuring of a focus portion of an exposure section of a lithography tool.

2. Background Art

Lithography systems are routinely calibrated to ensure the exposure optics are focused properly on a wafer surface. This decreases fabrication of devices that do not comply with certain tolerances by reducing printing or imaging errors caused by focus offset or focus tilt errors. One method of calibrating focus optics involves using a focus test reticle with structures that are patterned into a layer of photoresist on a wafer. The patterned structures are then evaluated manually using a microscope and recorded data is input into a spreadsheet to determine calibration compensation values. These values are used to calibrate the exposure optics. Typically, this method causes several hours of downtime a week while an operator fabricates the test wafer, analyzes if under the microscope, and enters the data. Thus, this method is time consuming, costly in terms of lost production time, and prone to errors due to reliance on human judgement. Other methods require the use of costly external equipment to generate calibration values.

Therefore, what is needed is a system and method to calibrate lithography tools by automating measurement of focus offset and focus tilt using an existing lithography system (e.g., a stepper alignment system) to evaluate a patterned structure or patterned structures.

BRIEF SUMMARY OF THE INVENTION

Embodiments of the present invention provide a method of calibrating a lithography tool. The method includes the step of exposing a wafer so that a resultant patterned image is tilted with respect to the wafer. The method also includes the step of developing the wafer. The method also includes the step of measuring characteristics of the tilted patterned image with a portion of the lithography tool to determine focus parameters of an exposure system. The method also includes the step of using the focus parameters to perform the calibrating step.

Other embodiments of the present invention provide a method including the step of exposing a wafer positioned at an angle so as to create a band-shaped pattern on the wafer that is tilted with respect to the wafer. The method also includes the step of developing the wafer. The method also includes the step of measuring characteristics of the patterned image with a wafer alignment system. The method also includes the step of determining focus parameters based on the measuring step. The method also includes the step of calibrating a focus portion of an exposure section of a lithography tool based on the determining step.

Still other embodiments of the present invention provide a method that includes the step of stepping a wafer along a predetermined axis. The method also includes the step of exposing the wafer at two or more points along the predetermined axis so that formed patterned images are tilted with respect to the wafer. The method also includes the step of developing the wafer. The method also includes the step of measuring characteristics of the patterned images with a wafer alignment system. The method also includes the step of determining focus parameters based on the measuring step. The method also includes the step of calibrating a focus portion of an exposure section of a lithography tool based on the determining step.

Advantages of the above embodiments are they only require one or more repeat exposures, and then the wafer alignment system of an exposure tool is used to measure the patterned structure or structures as opposed to a human or external equipment. No external measurement is required and opportunity for human error is eliminated. This saves both time and money.

Another advantage of at least some of the embodiments is that the patterns are printed at a tilt with respect to a wafer, which allows focus conditions during exposure to be monitored. These systems in method save both time and money, and virtually eliminate the measuring errors caused by human judgments.

Another advantage of at least some of the above embodiments is that by performing multiple exposures, multiple bands are produced, which allows for a Theta X (Tx) measurement as well as a Z measurement in a scanning lithography tool. The method can also be extended to monitor stepper characterization, of Z, Tx and Ty focus axis.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 5A shows a side view of a tilted wafer after being exposed with a band according to embodiments of the present invention.

FIG. 5B shows a top view of the wafer in FIG. 5A.

FIG. 6A shows a side view of a wafer at two exposure positions after being exposed at each position with a band according to embodiments of the present invention.

FIG. 6B shows a top view of the wafer of FIG. 6A.

FIG. 7A shows a side view of a wafer at two exposure positions after being exposed at each position with a band according to embodiments of the present invention.

FIG. 7B shows a top view of the wafer of FIG. 7A.

FIG. 8A shows a side view of a wafer at two exposure positions after being exposed at each position with a band according to embodiments of the present invention.

FIG. 8B shows a top view of the wafer of FIG. 8A.

Figure 1:
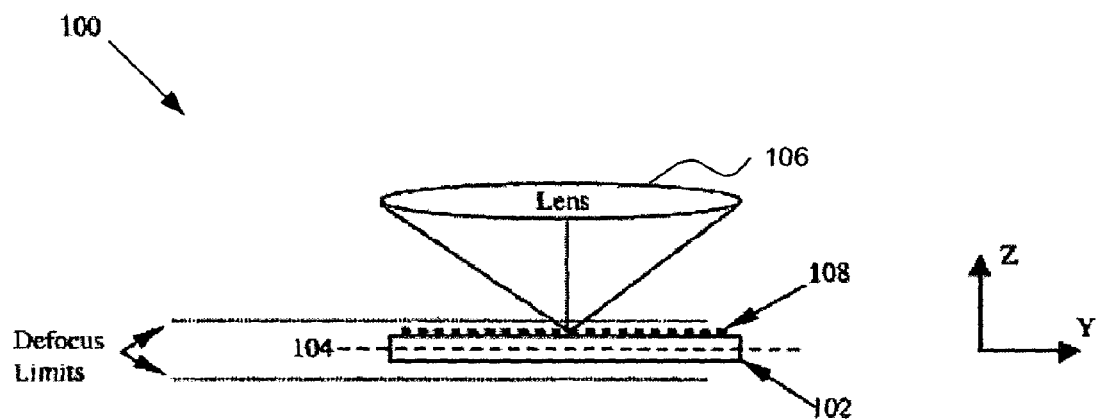
FIG. 1 shows an initial position of a wafer with respect to a reticle image plane according to embodiments of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Overview

According to the present invention, a reticle is populated with identical structures possessing a critical dimension (CD) near a resolution capability of a stepper being used. The structures are densely spaced, covering the entire exposure field. The reticle is exposed such that the image formed by the exposure tool's projection optics is tilted with respect to a wafer. The result of exposing the reticle image onto a tilted wafer is that only a portion of the reticle image will resolve upon the wafer within the usable depth of focus (UDOF) of the exposure tool. Within the UDOF, the structures will print in the photoresist. However, the structures falling outside the UDOF will not adequately resolve and the incident light will be adequate to clear away all of the photoresist. After proceeding through a develop process, a visible band of patterned photoresist will remain on the wafer.

When resist properties and exposure conditions remain constant characteristics of the system can be determined based on a band location and width. The location of the band is primarily a function of the focus offset and tilt. The width of the band is dependent on tilt, UDOF, resist sensitivity, exposure dose, and other factors. The contrast between the patterned band and the bare silicon wafer can be detected by a wafer alignment system. After the development process, the wafer is positioned back into the exposure tool and the precise locations of the patterned bands are established by the wafer alignment system. The locations of the bands can be used to calculate the focus offset and focus tilt errors that were present during the exposure step. The methods can also be extended to monitor stepper characterization, of Z, Tx and Ty focus errors.

FIG. 1 shows a portion 100 of an exposure section of a lithography tool according to embodiments of the present invention. FIG. 1 shows a side view of a field of view (e.g., a field or a surface) on a wafer 102 where an image plane 104 formed by projection optics 106 is properly focused. In this configuration, an image 108 prints properly over an entire length of a slot (not shown) of a reticle (not shown) onto substantially an entire length of the field.

As described below, a tilted grating monitoring method according to embodiments of the present invention relies on a basic principle of lithography that small features will not print and resolve when printed out of focus. This principle applies whether the defocus is positive or negative. Normally, wafer 102 is oriented to be in plane with image plane 104. For the purposes of discussion, an example employing a lithographic scanner will be described. However the same technique may be extended to analyze focus performance on any other lithography tool.

It is to be appreciated, exposing of a multiple test band or band on a wafer either in plane or tilted with respect to a focal plane of the focus optics can be performed and used for other lithography reasons. For example, to view a field on a wafer and to determine various characteristics and/or parameters of the field or the wafer for many different lithographic related reasons.

Figure 2A:
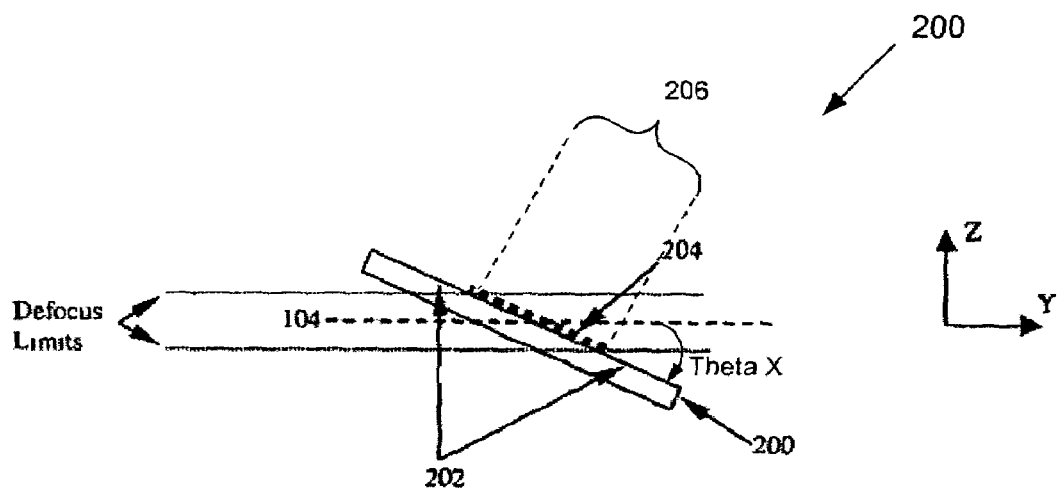
FIG. 2A shows a side view of a tilted wafer after being exposed with a band according to embodiments of the present invention.
Figure 2B:
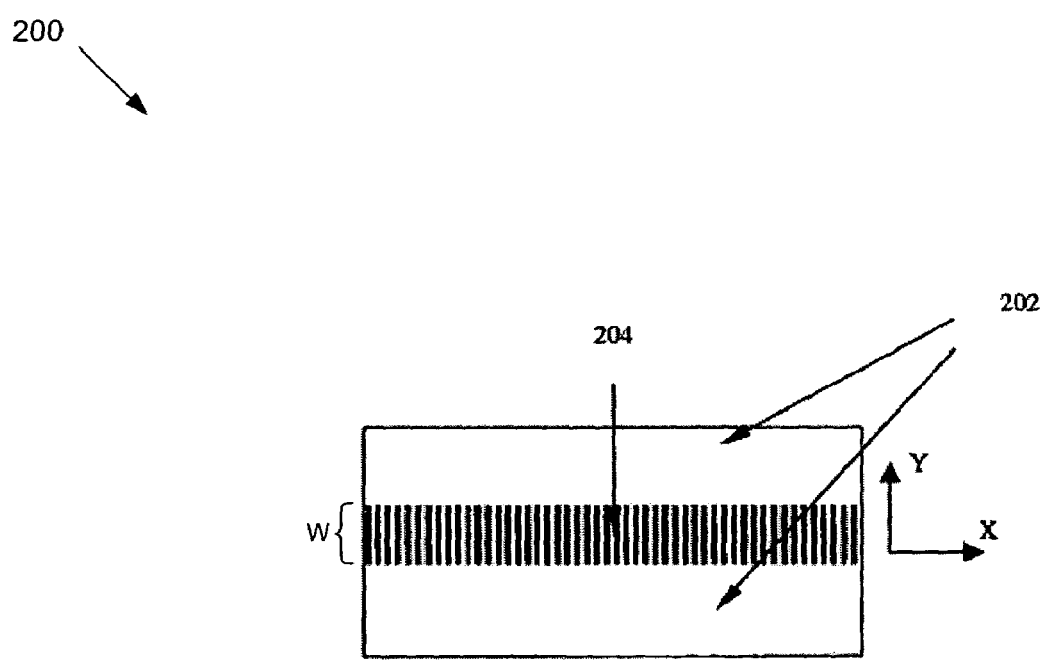
FIG. 2B shows a front view of the wafer of FIG. 2A.

Calibrating a Focus Portion Based on Measuring Focus Parameters with One Patterned Band FIGS. 2A and 2B show a wafer 200 according to embodiments of the present invention. Wafer 200 is purposely tilted so that areas 202 of the field of wafer 200 that are out of focus have no printed features. The presence of printed features only in a center of the field of the wafer 200 results in a band 204. Thus, areas 202 have no features or resolved or printed because they are out of focus. As shown by orienting axes in FIGS. 2A and 2B, an X-axis runs into the page in FIG. 2A, as does the scanned exposure that runs along the X-axis. Introducing a tilt about the X-axis allows a center 206 of the field to remain in focus, while the top and bottom edges (e.g., areas 202) of the field go out of focus. Given a limited depth of focus, fine features do not resolve well at the top and bottom (e.g., areas 202) of the printed field.

Figure 3:
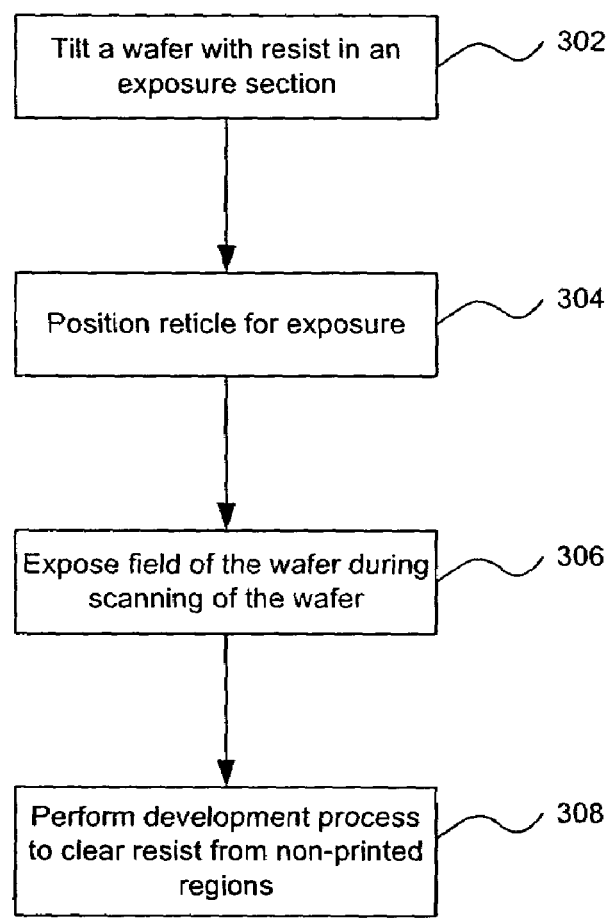
FIG. 3 shows a flow chart of a method for forming a band on a wafer according to embodiments of the present invention.

FIG. 3 shows a flow chart depicting a tilted grating monitoring method 300 according to embodiments of the present invention. At step 302, a wafer (e.g., wafer 200) is tilted Theta X (Θx) (shown in FIG. 2A) from a nominal image plane (e.g., plane 104) in an exposure section. At step 304, a grating reticle (e.g., a reticle filled with fine features) is positioned to expose the wafer. At step 306, a field (e.g., a surface of wafer 200) is exposed during scanning of the wafer along the X-axis. The tilt causes the top and bottom regions (e.g., areas 202) of each field to be printed out of focus. This results in the small lines of the grating not resolving at the top and bottom (e.g., areas 202) regions of the field when the resist (e.g., positive resist) in these regions of the field get cleared away. After clearing away these regions, a band (e.g., band 204) remains in a center potion (e.g., portion 206) of the field. At step 308, a development process is performed on the wafer to clear resist from regions (e.g., areas 202) where the image did not print due to defocus.

With reference again to FIGS. 2A and 2B, the characteristic of printed band 204 allows for some characterization of focus performance. For example, how precisely band 204 is centered along a Y-axis of the field is dependent on how well a focus system (not shown) established Z while exposing. Also, how precisely width W of band 204 is generated is related to how well the focus systems control Theta-X. Thus, by measuring these characteristics of band 204 with an alignment systems metrology system, compensation values are determined and used to calibrate the exposure optics.

Figure 4A:
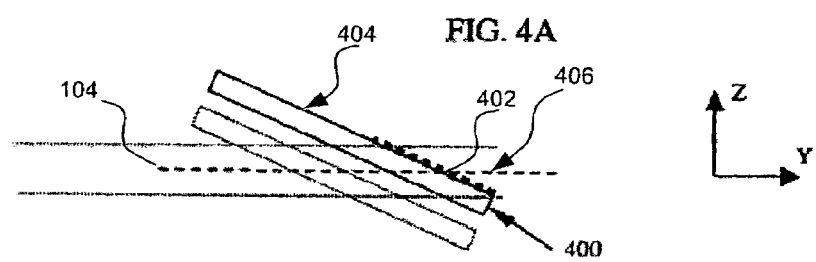
FIG. 4A shows a side view of a tilted wafer after being exposed with a band according to embodiments of the present invention.
Figure 4B:
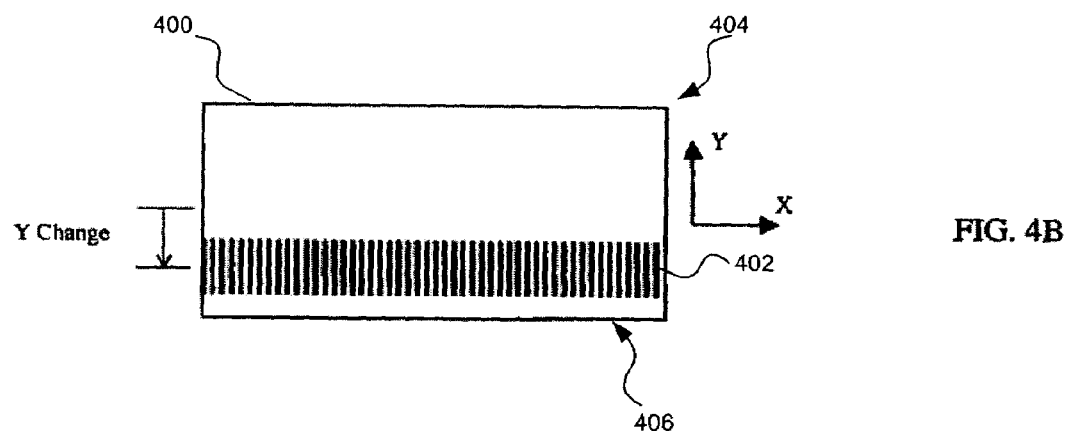
FIG. 4B shows a top view of the wafer in FIG. 4A.

FIGS. 4A and 4B show a wafer 400 according to embodiments of the present invention. In these figures, wafer 400 is created with the same Theta-X tilt as FIGS. 2A and 2B, but a Z focus offset is introduced. This change moves a printed band 402 away from a central X-axis. The Z focus offset has shifted the in-focus region from a center 404 to an edge 406 of the field. The relationship between band position and the Z offset is a function of the induced Theta-X tilt.

FIGS. 5A and 5B show a wafer 500 according to embodiments of the present invention. Wafer 500 has been exposed with Theta X offset from nominal, which affects a width W of band 502. A vertical width W of printed band 502 can also be affected by process parameters, such as dose, resist thickness, and resists choice among others. For example, width W1 may be a nominal width and width W2 may be a width caused by the above factors. This makes it difficult to establish a scale factor and nominal readings for Theta-X to band size. To overcome this difficulty, the embodiments discussed below expose and measure multiple bands, with two bands used merely as an example embodiment.

Figures 6C, 6D:
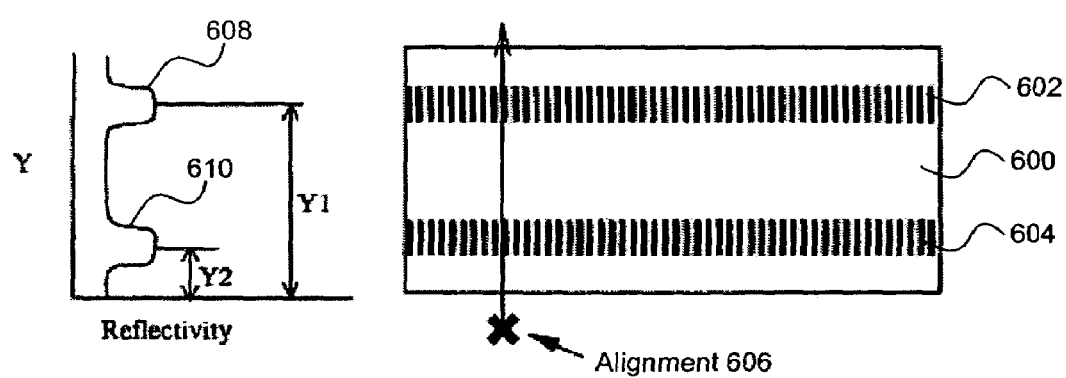
FIG. 6C shows a scanning beam that scans the wafer in FIGS. 6A and 6B.
FIG. 6D shows a graph generated from scanning using a lithography tool's alignment system beam to determine characteristics of patterns on the wafer in FIGS. 6A, 6B, and 6C according to embodiments of the present invention.

Calibrating a Focus Portion Based on Measuring Focus Parameters with Multiple Patterned Bands FIGS. 6A and 6B show two exposure positions for a wafer 600 according to embodiments of the present invention. Wafer 600 includes two pattern areas or bands 602 and 604. Band 602 is formed when wafer 600 is positioned at Z offset 2 and band 604 is formed when wafer 600 is positioned at Z offset 1. FIG. 6C shows a scanning beam 606, which can come from an alignment system in the lithography tool, that scans along a Y axis to detect bands 602 and 604. FIG. 6D shows a graph generated from detection of reflected light from wafer 600. As is shown, bands 602 and 604 cause higher levels of reflected intensity 608 and 610, respectively. This can be preferably based on reflectivity effects of light, although scattering effects can also be detected. The reflectivity and/or scattering effects of light are based on the light hitting a rough surface (e.g., bands 602 and 604) compared to just reflecting from a smooth or relatively smoother surface (e.g., unpatterned areas of wafer 600).

FIGS. 7A and 7B show two exposure positions for a wafer 700 according to embodiments of the present invention. Wafer 700 includes two pattern areas or bands 702 and 704. Band 702 is formed when wafer 700 is positioned at Z offset 2 and band 704 is formed when wafer 700 is positioned at Z offset 1. The wafer position for wafer 600 in FIGS. 6A and 6B is shown in phantom in FIG. 7A. By moving wafer 700 a distance Z shift from a position of wafer 600, bands 702 and 704 are shifted upwards Y1 change and Y2 change, respectively, on wafer 700.

FIGS. 8A and 8B show two exposure positions for a wafer 800 according to embodiments of the present invention. Wafer 800 includes two pattern areas or bands 802 and 804. Band 802 is formed when wafer 800 is positioned at Z offset 2 and band 804 is formed when wafer 800 is positioned at Z offset 1. The wafer position for wafer 600 in FIGS. 6A and 6B is shown in phantom. Thus, by rotating wafer 800 a distance Tx-shift from a position of wafer 600, bands 802 and 804 are shifted upwards Y1-change and downward Y2-change, respectively, on wafer 800.

FIGS. 6-8 show the use of a double tilted grating technique that helps to uncouple Z and Theta-X from the issues that affect band size, as discussed above with respect to single band wafers. Although these embodiments are shown with two bands, it is to be appreciated any number of parallel bands can be formed and measured without departing from the scope of the invention. In embodiments showing the double tilted grating method, the field is exposed twice. The same induced Theta-X tilt is used for both exposures. However, a different Z offset is introduced on each exposure in order to move the resulting grating to the top and bottom of the field. This results in two bands being printed. Thus, the double band tilted grating test uses a Z focus offset in combination with a known Theta X tilt to print a set of grating bands that is offset from the center of the field. In the embodiments shown, each field is exposed twice, once with a positive Z offset and once with a negative Z offset. The result is two bands, one in the top half of the field and one in the bottom half of the field.

In some embodiments, the following formulas are used to determine Z and Theta X. It is to be appreciated, other known formulas for determining these values can also be used. The location of the center of each band in the field (such as shown in FIG. 6B) is referred to as Y Position, which can be defined by the following formula:

$$YPosition = \frac{ZOffset}{\operatorname{Sin}(ThetaX)}$$

For small angles, $\operatorname{Sin}(\theta) \approx \theta$ so the equation simplifies to:

$$YPosition = \frac{ZOffset}{ThetaX}$$

If system focus errors are incorporated, the equation becomes:

$$YPosition = \frac{ZOffset + \Delta Z}{ThetaX + \Delta Tx}$$

Where $\Delta Z$ and $\Delta Tx$ are the system focus errors. Creating an equation for each of the two bands results in:

$$Y_1 = \frac{Z_1 + \Delta Z}{Tx + \Delta Tx} \quad Y_2 = \frac{Z_2 + \Delta Z}{Tx + \Delta Tx}$$

Notice that the same system focus errors and Tx offset apply to both bands. Solving the first equation for $\Delta Z$ and the second for $\Delta Tx$ gives:

$$\Delta Z = Y_1(Tx + \Delta Tx) - Z_1$$

$$\Delta Tx = \frac{Z_2 + \Delta Z}{Y_2} - Tx$$

Substituting one into the other and solving gives us our final equations for the system focus errors:

$$\Delta Z = \frac{Y_1 \cdot Z_2 - Y_2 \cdot Z_1}{Y_2 - Y_1}$$

$$\Delta Tx = \frac{Z_2 - Z_1}{Y_2 - Y_1} - Tx$$

In these formulas, the delta Z and Tx system focus errors are not affected by the width of the bands. Therefore, they are independent of process effects, to a first order approximation.

In some embodiments, the location of the bands is determined with a native alignment system in a lithographic exposure tool. As discussed above, by scanning an illumination beam (FIG. 6C) along the Y axis and measuring the diffraction efficiency or reflectivity of the wafer surface, the locations of the bands can be measured (FIG. 6D). In this fashion, one can expose a double tilted grating, develop the wafer, and have it scanned by the lithographic exposure tool to assess one or more focus performance factors in a relatively quick fashion. Then, these factors can be easily used to generate compensation values to calibrate the lithography tool, as discussed above.

Methods of Calibrating Focus

Figure 9:
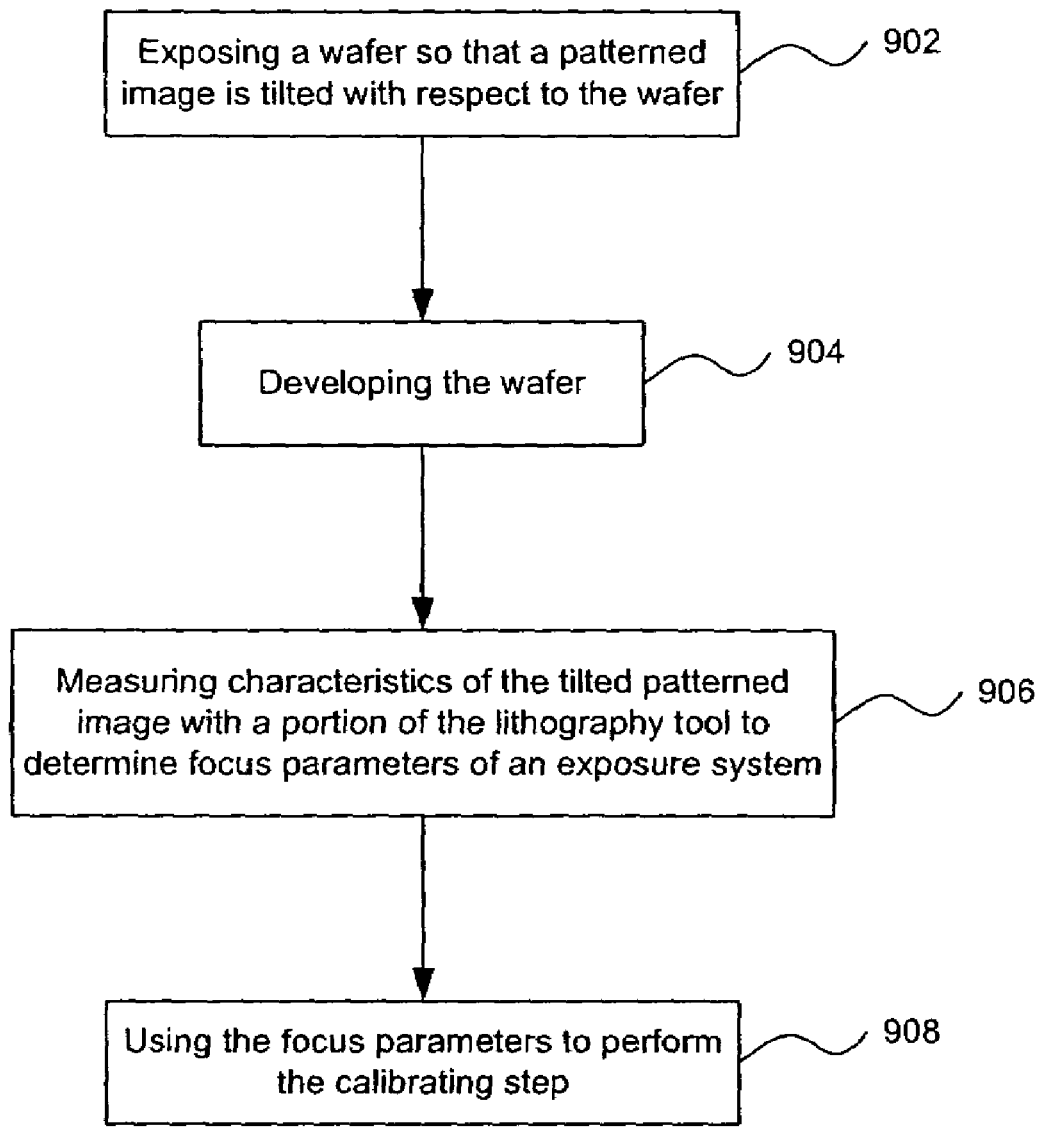
FIG. 9 shows a flow chart depicting a calibration method according to embodiments of the present invention.

FIG. 9 shows a flow chart depicting a method 900 according to embodiments of the present invention. At step 902, a wafer is exposed so that a patterned image is tilted with respect to the wafer. In a preferred embodiment, the tilting can be imposed based on controlling a wafer stage to tilt the wafer. Other embodiments include controlling the reticle stage to tilt the reticle. At step 904, the wafer is developed. At step 906, characteristics of the tilted patterned image are measured with a portion of the lithography tool to determine focus parameters of an exposure system. The measuring step can measure band width and/or band location of the tilted patterned image. The focus parameters can be focus tilt errors and/or focus offset, for example. At step 908, the focus parameters are used to perform calibration. Calibration is done by either automatically or manually entering compensation values for the measured focus parameters into the lithography tool.

Figure 10:
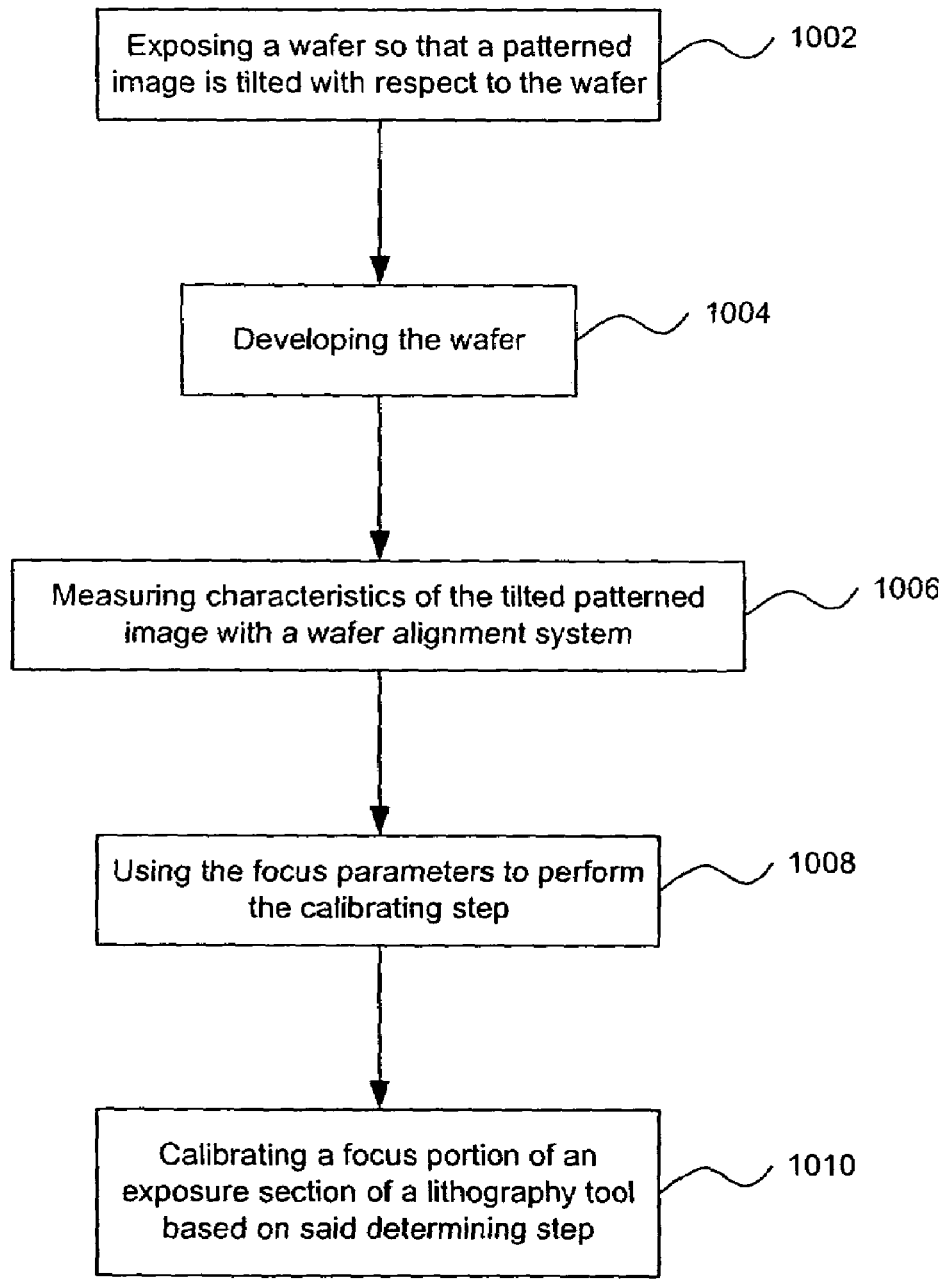
FIG. 10 shows a flow chart depicting a calibration method according to embodiments of the present invention.

FIG. 10 shows a flow chart depicting a method 1000 according to embodiments of the present invention. At step 1002, a wafer is exposed so that a patterned image is tilted with respect to the wafer. The tilting can be imposed based on controlling a reticle stage, for example. At step 1004, the wafer is developed. At step 1006, characteristics of the patterned image are measured with a wafer alignment system. The measuring step can measure band width and/or band location of the tilted patterned image. At step 1008, focus parameters are determined based on the measuring step. The focus parameters can be focus tilt errors and/or focus offset, for example. At step 1010, a focus portion of an exposure section of a lithography tool is calibrated based on the determining step. Calibration is done by either automatically or manually entering compensation values for the measured focus parameters into the lithography tool.

Figure 11:
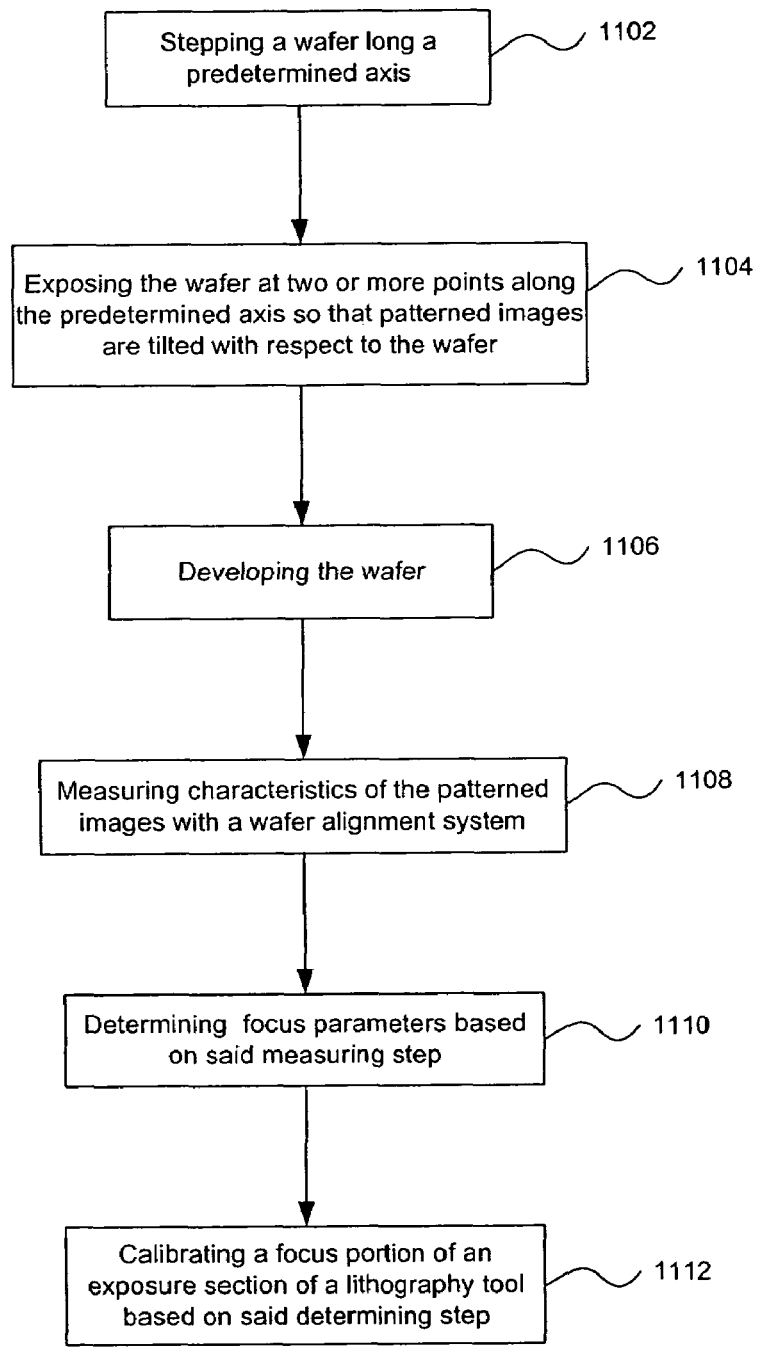
FIG. 11 shows a flow chart depicting a calibration method according to embodiments of the present invention.

FIG. 11 shows a flow chart depicting a method 1100 according to embodiments of the present invention. At step 1102, a wafer is stepped along a predetermined axis. At step 1104, the wafer is exposed at two or more points along the predetermined axis so that patterned images are tilted with respect to the wafer. The tilting can be imposed based on controlling a reticle stage, for example. At step 1106, the wafer is developed. At step 1108, characteristics of the patterned images are measured with a wafer alignment system. The measuring step can measure band width and/or band location of the tilted patterned image. At step 1110, focus parameters are measured based on said measuring step. The focus parameters can be focus tilt errors and/or focus offset, for example. At step 1112, a focus portion of an exposure section of a lithography tool is calibrated based on said determining step. Calibration is done by either automatically or manually entering compensation values for the measured focus parameters into the lithography tool.

Exemplary System

Figure 12:
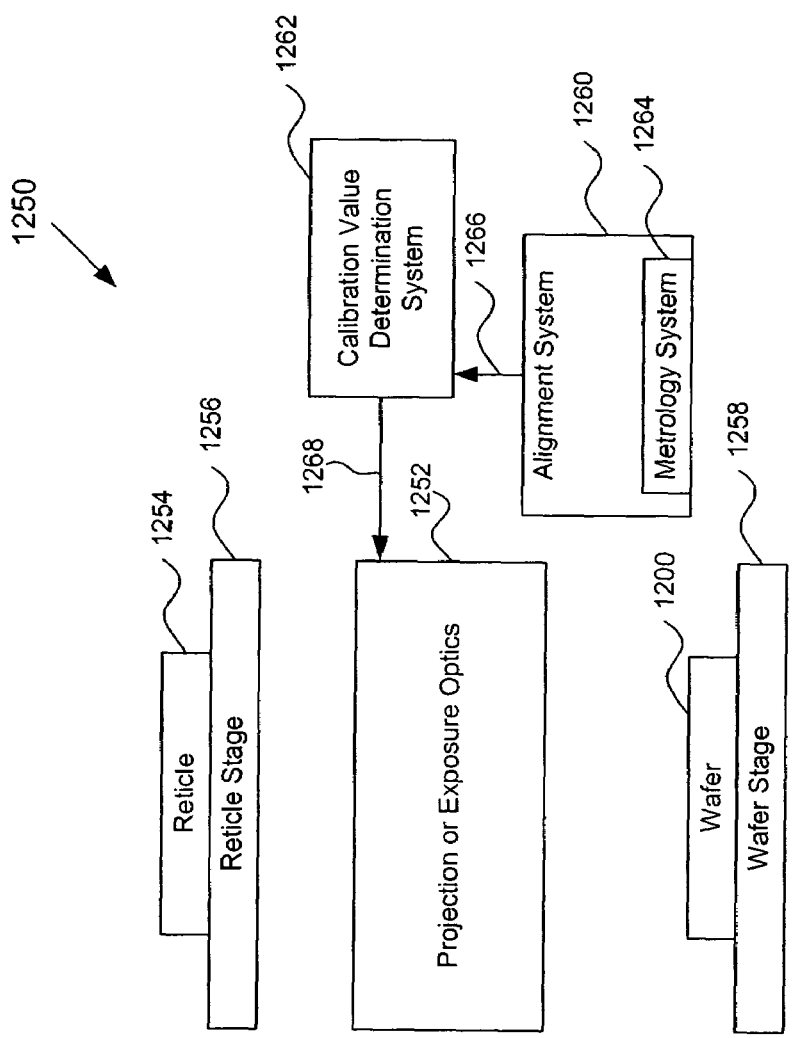
FIG. 12 shows a portion of a lithography system used to calibrate exposure or projection optics.

FIG. 12 shows a portion 1250 of a lithography system used to calibrate optics 1252 (exposure or projection optics). Portion 1250 can be used to perform one or more of the calibration methods discussed above in regards to FIGS. 1–11. Portion 1250 comprises a reticle 1254 on a reticle stage 1256, optics 1252, a wafer 1200 on a wafer stage 1258, an alignment system 1260, and a calibration value determining system 1262. In one example, alignment system 1260 comprises a metrology system 1264. As discussed above, alignment system 1260 or metrology system 1264 is used to measure features formed on wafer 1200, as discussed above, to produce a measured signal 1266. Measured signal 1266 is processed in calibration value determining system 1262 to form a calibration signal 1268. Calibration signal 1268 is used to calibrate optics 1252. Thus, portion 1250 allows for automated calibration of optics 1252.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
   means for exposing a wafer so that a resultant patterned image is tilted with respect to the wafer;
   a metrology system that performs an automated measurement of characteristics of the tilted patterned image to determine focus parameters of an exposure system; and
   a calibration device that automatically calibrates the lithographic apparatus using the focus parameters from the automated measurement.

2. The lithographic apparatus of claim 1, wherein the metrology system measures focus tilt errors of the exposure system.

3. The lithographic apparatus of claim 1, wherein the metrology system measures focus offset of the exposure system.

4. The lithographic apparatus of claim 1, wherein the metrology system measures a band location of the tilted patterned image.

5. The lithographic apparatus of claim 1, further comprising:
   a reticle stage that tilts a reticle to impose the tilt in the resultant patterned image.

6. The lithographic apparatus of claim 1, further comprising:
   a wafer stage that moves the wafer along a predetermined axis during an exposing operation to form at least one additional tilted patterned image on the wafer.

7. The lithographic apparatus of claim 6, wherein the metrology system measures a distance between the tilted patterned images.

8. The lithographic apparatus of claim 6, wherein the metrology system measures a distance of a center axis of the tilted patterned images from a center axis of the wafer.

9. A lithographic apparatus, comprising:
- a means for exposing a wafer positioned at an angle so as to create a band-shaped etch pattern on the wafer that is tilted with respect to the wafer;
- a wafer alignment system that measures characteristics of the patterned image and determines focus parameters; and
- a calibrating device that calibrates a focus portion of an exposure section of a lithography apparatus based on the focus parameters.

10. The lithographic apparatus of claim 9, wherein wafer alignment system determines focus tilt errors of the focus portion.

11. The lithographic apparatus of claim 9, wherein wafer alignment system determines focus offset of the focus portion.

12. The lithographic apparatus of claim 9, wherein wafer alignment system measures a band location of the tilted patterned image.

13. The lithographic apparatus of claim 9, further comprising:
- a reticle stage that tilts a reticle impose the tilt in the band-shaped etch pattern on the wafer.

14. The lithographic apparatus of claim 9, further comprising:
- a wafer stage that moves the wafer along a predetermined axis during an exposing operation to form at least one additional tilted patterned image on the wafer.

15. The lithographic apparatus of claim 14, wherein the wafer alignment system measures a distance between the tilted patterned images.

16. The lithographic apparatus of claim 14, wherein the wafer alignment system measures a distance of a center axis of the tilted patterned images from a center axis of the wafer.

* * * * *